United States Patent
Bi et al.

(10) Patent No.: US 11,017,700 B2
(45) Date of Patent: May 25, 2021

(54) CIRCUIT WORKING STATE TESTING METHOD AND TESTING DEVICE

(71) Applicants: ORDOS YUANSHENG OPTOELECTRONICS CO., LTD., Inner Mongolia (CN); BOE TECHNOLOGY GROUP CO., LTD., Beijing (CN)

(72) Inventors: Haifeng Bi, Beijing (CN); Wulijibaier Tang, Beijing (CN); Long Lian, Beijing (CN); Xiaojie Wang, Beijing (CN); Ruijun Hao, Beijing (CN)

(73) Assignees: ORDOS YUANSHENG OPTOELECTRONICS CO., LTD., Inner Mongolia (CN); BOE TECHNOLOGY GROUP CO., LTD., Beijing (CN)

( * ) Notice: Subject to any disclaimer, the term of this patent is extended or adjusted under 35 U.S.C. 154(b) by 32 days.

(21) Appl. No.: 16/329,902

(22) PCT Filed: May 28, 2018

(86) PCT No.: PCT/CN2018/088745
§ 371 (c)(1),
(2) Date: Mar. 1, 2019

(87) PCT Pub. No.: WO2018/223865
PCT Pub. Date: Dec. 13, 2018

(65) Prior Publication Data
US 2019/0228691 A1    Jul. 25, 2019

(30) Foreign Application Priority Data
Jun. 8, 2017   (CN) .......................... 201710429375.3

(51) Int. Cl.
G09G 3/00    (2006.01)
G06N 3/08    (2006.01)
(Continued)

(52) U.S. Cl.
CPC ......... G09G 3/006 (2013.01); G01R 31/2836 (2013.01); G01R 31/317 (2013.01);
(Continued)

(58) Field of Classification Search
CPC .. G09G 3/006; G09G 3/20; G09G 2310/0267; G09G 2310/0286;
(Continued)

(56) References Cited

U.S. PATENT DOCUMENTS 5,537,327 A * 7/1996 Snow ..................... G01R 31/50
                                                 700/293
5,724,247 A   3/1998 Dalstein
(Continued)

FOREIGN PATENT DOCUMENTS

CN   101221213 A   7/2008
CN   101231672 A   7/2008
(Continued)

OTHER PUBLICATIONS

Yuan et al., "A new neural network-based fault diagnosis approach for analog circuits by using kurtosis and entropy as a pre-processor" Mar. 2010 (Year: 2010).*
(Continued)

*Primary Examiner* — Tung X Nguyen
*Assistant Examiner* — Feba Pothen

(57) ABSTRACT

There are provided a detection method and detection apparatus of an operating state of a circuit. The method includes: forming a neural network that acquires a state category of a circuit to be detected; measuring electrical characteristic parameters of at least one node in the circuit to be detected;
(Continued)

inputting the measured electrical characteristic parameters of at least one node to the neural network, and obtaining the state category of the circuit to be detected through the neural network.

15 Claims, 5 Drawing Sheets

(51) Int. Cl.
 *G01R 31/28* (2006.01)
 *G01R 31/317* (2006.01)
 *G09G 3/20* (2006.01)

(52) U.S. Cl.
 CPC ............. *G06N 3/08* (2013.01); *G09G 3/20* (2013.01); *G09G 2310/0267* (2013.01); *G09G 2310/0286* (2013.01)

(58) Field of Classification Search
 CPC .............. G01R 31/2836; G01R 31/317; G01R 31/309; G01R 31/50; G06N 3/08; G06N 3/06
 See application file for complete search history.

(56) References Cited

U.S. PATENT DOCUMENTS

| | | | |
|---|---|---|---|
| 7,554,296 B2 * | 6/2009 | Mizuno | G01R 31/3842 320/132 |
| 2007/0130491 A1 | 6/2007 | Mazumder | |
| 2012/0158620 A1 * | 6/2012 | Paquet | G06N 20/00 706/12 |

FOREIGN PATENT DOCUMENTS

| | | |
|---|---|---|
| CN | 101231673 A | 7/2008 |
| CN | 101404071 A | 4/2009 |
| CN | 101819253 A | 9/2010 |
| CN | 101871994 A | 10/2010 |
| CN | 102129030 A | 7/2011 |
| CN | 102305910 A | 1/2012 |
| CN | 103267941 A | 8/2013 |
| CN | 103439647 A | 12/2013 |
| CN | 107192939 A | 9/2017 |
| JP | 2000-329812 A | 11/2000 |

OTHER PUBLICATIONS

Reyes et al., "Fault detection and measurements correction for multiple sensors using a modified autoassociative neural network" Jul. 2012 (Year: 2012).*

Hongbo Zhang et al; "Principal Component Analysis and Probabilistic Neural Networks and Its Application in Fault Diagnosis of Analog Circuits", Computer Measurement & Control, vol. 16. No. 12, Dec. 25, 2008; pp. 1789-1791 and 1827*NPL-7**.

Yuan Hao et al; "PNN Based Fault Diagnosis for Analog Circuit with Tolerance", Microcomputer Information, No. 12-1, vol. 24, pp. 145-156, 152; Published Dec. 5, 2008**NPL-8****.

Hongbo Zhang; "Network Analog Circuits Based on Principal Components", (CD-ROM) Electronic Magazine Co., Ltd., No. 1, pp. I140-301; published Jan. 15, 2009; **NPL-16****.

Yuan Bao; "Fault Diagnosis Method of Tolerance Analog Circuit", (CD-ROM) Electronic Magazine Co., Ltd., No. 8, pp. 1135-160, published Aug. 15, 2009;***NPL-17***.

Liu Daping; "Fault Diagnosis of Analog Circuits based on Neural Networks", (CD-ROM) Electronic Magazine Co., Ltd., No. 3, pp. 1140-182; published Mar. 15, 2012; ***NPL-18***.

First Chinese Office Action dated Mar. 20, 2019; Appln. No. 201710429375.3.

International Search Report and Written Opinion dated Aug. 15, 2018; PCT/CN2018/088745.

Extended European Search Report dated Feb. 12, 2021; Appln. No. 18814279.8.

* cited by examiner

CIRCUIT WORKING STATE TESTING METHOD AND TESTING DEVICE

CROSS-REFERENCE TO RELATED APPLICATION

The present application claims the priority of a Chinese patent application No. 201710429375.3 filed on Jun. 8, 2017, with an invention title of "DETECTION METHOD AND DETECTION SYSTEM FOR AN OPERATING STATE OF A CIRCUIT". Herein, the content disclosed by the Chinese patent application is incorporated in full by reference as a part of the present application.

TECHNICAL FIELD

The present disclosure relates to detection technique field, in particular to a detection method and a detection apparatus for an operating state of a circuit.

BACKGROUND

In a thin film transistor-liquid crystal display (TFT-LCD) product, failures such as abnormal display would always occur to the product due to array manufacture procedure defects or design defects, and these problems are mostly caused by faults existing in the circuit of the product. By taking a gate driver on array (GOA) circuit as an example, the faults existing in the GOA circuit are usually classified into hard faults and soft faults. The hard fault refers to open circuit or short circuit which occurs to an element. When a hard fault occurs in the GOA circuit, topology structure of the circuit would change, thereby causing complete failure of the product. The soft fault means that a parameter of the element exceeds a predetermined tolerance range. When the GOA circuit has a soft fault, the soft fault would not directly cause complete failure of the product, but display performance of the product will be still influenced.

In order to accurately find the causes of failures which occur to the product, performing fault detection on the GOA circuit becomes an essential step.

SUMMARY

There is provided in a first aspect of the present disclosure a detection method for an operating state of a circuit, comprising: forming a neural network that acquires a state category of a circuit to be detected; measuring an electrical characteristic parameter of at least one node in said circuit to be detected, inputting the measured electrical characteristic parameter of the at least one node to said neural network, and obtaining the state category of said circuit to be detected through said neural network.

In one example, forming the neural network that acquires a state category of a circuit to be detected comprises: constructing a neural network model; constructing a fault training sample set, wherein said fault training sample set comprises a plurality of state categories and the electrical characteristic parameter of at least node in said circuit to be detected corresponding to each state category of the plurality of state categories, and said plurality of state categories comprise a normal state and at least one fault state of said circuit to be detected; training said neural network model according to said fault training sample set to obtain a trained neural network, wherein said neural network is used to acquire the state category of said circuit to be detected.

In one example, constructing the fault training sample set comprises: setting said circuit to be detected according to each state category of said plurality of state categories, and measuring an electrical characteristic parameter of at least one node in a set circuit to be detected; constructing the fault training sample set according to said plurality of state categories and the electrical characteristic parameter of at least one node corresponding to each state category of said plurality of state categories.

In one example, setting said circuit to be detected according to each state category of said plurality of state categories comprises at least one of following operations: when said plurality of state categories comprise at least one hard fault state category, setting an element in said circuit to be detected corresponding to each hard fault state category of said at least one hard fault state category as a short circuit state or an open circuit state; and when said plurality of state categories comprise at least one soft fault state category, setting a parameter of an element in said circuit to be detected corresponding to each soft fault state category of said at least one soft fault state category as exceeding its tolerance range, and performing a Monte Carlo transient analysis on said set circuit to be detected.

In one example, training said neural network model according to said limit training sample set to obtain a trained neural network comprises: constructing a fault sample target set, wherein said fault sample target set is a correspondence relationship between a binary code output by said neural network and said plurality of state categories; inputting said fault training sample set to said neural network model to train said neural network model, to acquire the trained neural network.

In one example, before constructing a fault sample target set, said method further comprises: performing dimension-reduction processing on electrical characteristic parameter data of at least one node corresponding to each state category of said plurality of state categories in the fault training sample set.

In one example, forming the neural network that acquires the state category of the circuit to be detected comprises: constructing a correction sample set, wherein the correction sample set comprises a plurality of state categories and an electrical characteristic parameter of at least one node in said circuit to be detected corresponding to each state category of said plurality of state categories; after training said neural network model according to said fault training sample set to obtain a trained neural network, further comprising: correcting the trained neural network according to said correction sample set.

In one example, constructing the correction sample set comprises: setting said circuit to be detected according to each state category of said plurality of state category, and measuring the electrical characteristic parameter of at least one node in a set circuit to be detected; constructing a correction sample set according to said plurality of state categories and an electrical characteristic parameter of at least one node corresponding to each state category of said plurality of state categories.

In one example, setting said circuit to be detected according to each state category of said plurality of state categories comprises at least one of following operations: when said plurality of state categories comprise at least one hard fault state category, setting an element in said circuit to be detected corresponding to each hard fault state category of said at least hard fault state category as a short circuit state or an open circuit state; and, when said plurality of state categories comprise at least one soft fault state category, setting a parameter of an element in said circuit to be detected corresponding to each soft fault state category of said at least one soft fault state category as exceeding its tolerance range, and performing a Monte Carlo transient analysis on a set circuit to be detected.

In one example, correcting a trained neural network according said correction sample set comprises: inputting the electrical characteristic parameter of at least one node in said correction sample set corresponding to each state category of said plurality of state categories into the trained neural network, so that the trained neural network outputs a binary code, comparing a correspondence relationship between an output binary code and a state category in said correction sample set corresponding to the electrical characteristic parameter of said at least one node with said fault sample target set, determining whether an output result of said neural network is accurate, and if it is determined as accurate, then the trained neural network is used to perform fault detection on said circuit to be detected; if it is determined as inaccurate, then the trained neural network is re-trained.

There is provided in a second aspect of the present disclosure a detection apparatus for an operating state of a circuit, comprising: a neural network forming module, configured to form a neural network that acquires a state category of a circuit to be detected; a measuring module, configured to measure an electrical characteristic parameter of at least one node in said circuit to be detected; a detection module, connected to said neural network forming module and said measuring module respectively, and configured to acquire said neural network and an electrical characteristic parameter of at least one node in said circuit to be detected, input an acquired electrical characteristic parameter of at least one node to said neural network, and obtain the state category of said circuit to be detected through said the neural network.

In one example, said neural network forming module comprises: a model constructing sub-module, configured to construct a neural network model; a training sample set constructing sub-module, configured to construct a fault training sample set; a training sub-module, connected to said module constructing sub-module, said training sample set constructing sub-module and said detection module constructing sub-module respectively and configured to acquire said fault training sample set and said neural network model, and train said neural network model according to said fault training sample set to obtain a trained neural network.

In one example, said training sample set constructing sub-module comprises at least one of a hard fault training sample set constructing unit and a soft fault training sample set constructing unit connected to said training sub-module, wherein said hard fault training sample set constructing unit is configured to construct a hard fault training sample set; said soft fault training sample set constructing unit is configured to construct a soft fault training sample set.

In one example, said training sub-module comprises: a target set constructing unit, configured to construct a fault sample target set, said fault sample target set being a correspondence relationship between a binary code output by said neural network and said plurality of state categories; a training execution unit, connected to said detection module, said target set constructing unit, said model constructing sub-module and said training sample set constructing sub-module respectively, and configured to acquire said fault sample target set and said neural network model, input said fault training sample set to said neural network model, and train said neural network according to said fault sample target set to obtain a trained neural network.

In one example, said training sub-module further comprises: a dimension reduction unit, connected to said training sample set constructing sub-module and said training execution unit respectively, and configured to perform dimension-reduction processing on electrical characteristic parameter of at least one node in said fault training sample set corresponding to each state category of different state categories.

In one example, said neural network forming module comprises a correction sample set constructing sub-module, configured to construct a correction sample set; said training sub module comprises a correction unit connected to said correction sample set constructing sub-module and said training execution unit respectively and configured to correct the trained neural network according to said correction sample set.

In one example, said correction sample set constructing sub-module comprises at least one of a hard fault correction sample set constructing unit and a soft fault correction sample set constructing unit connected to said correction unit; wherein said hard fault correction sample set constructing unit is configured to construct a hard fault correction sample set; said soft fault correction sample set constructing unit is configured to construct a soft fault correction sample set.

There is provided in a third aspect of the present disclosure a computer readable storage medium, configured to store computer instructions, wherein said computer instructions executes one or more steps in said detection method of the operating state of the circuit as described in the first aspect of the present disclosure when being ran by a processor.

There is provided in a fourth aspect of the present disclosure a computer product, comprising one or more processors, wherein said processor is configured to run computer instructions to execute one or more steps of said detection method of the operating state of the circuit as described in the first aspect of the present disclosure.

BRIEF DESCRIPTION OF THE DRAWINGS

In order to describe technical solutions in embodiments of the present disclosure more clearly, accompanying figures that need to be used in the embodiments will be introduced simply. Obviously, the accompanying figures in the following description are just some embodiments of the present disclosure. For those ordinary skilled in the art, other accompanying figures can be obtained according to these accompanying figures without paying any inventive labor.

DETAILED DESCRIPTION

In order to make purposes, features and advantages of the present disclosure easier to be understood, technical solutions in embodiments of the present disclosure will be described clearly and completely by combining with accompanying figures in the embodiments of the present disclosure. Obviously, the embodiments described below are just a part of embodiments of the present disclosure, but not all the embodiments. Based on the embodiment in the present disclosure, all the other embodiments obtained by those ordinary skilled in the art without paying any inventive labor shall fall into the scope sought for protection in the present disclosure.

In the related art, faults of the GOA circuit are detected usually by means of performing microscope detection on the GOA region under a microscope. However, this means can detect only hard faults, while soft faults of the GOA circuit cannot be identified. Therefore, additional determination on whether a GOA film layer is abnormal by means of TFT characteristics testing or scanning electron microscope (SEM) splicing is needed, so as to detect soft faults of the GOA circuit. However, the above-mentioned two detection methods both spend too much time, and have low detection efficiency, and thus being disadvantageous for analyzing and improving the failures of the GOA circuit.

Figure 1:
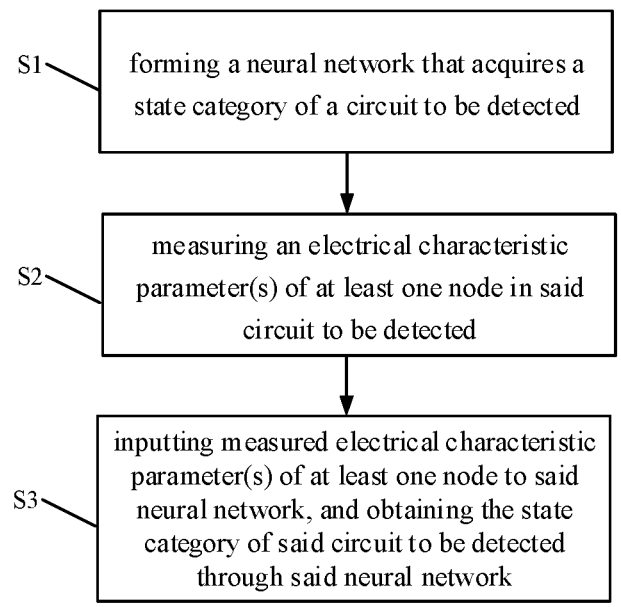
FIG. 1 is a first flow chart of a detection method for an operating state of a circuit provided in a first embodiment of the present disclosure.

As shown in FIG. 1, there is provided in the present embodiment a detection method for an operating state of a circuit. The detection method for the operating state of the circuit may comprise: step S1, forming a neural network that acquires a state category of a circuit to be detected; step S2, measuring electrical characteristic parameters of at least one node in the circuit to be detected; and step S3, inputting the measured electrical characteristic of at least one node to the neural network, and obtaining the state category in the circuit to be detected through the neural network.

In the detection method for the operating state of the circuit provided in the embodiments of the present disclosure, by inputting the measured electrical characteristic parameters of at least one node in the circuit to be detected into the neural network, the state category of the circuit to be detected can be obtained through the neural network. The detection method for the operating state of the circuit provided in the embodiments is based on the neural network. The neural network has advantages of self-learning, massively parallel processing, distributed storing and processing data and in the process of detecting, the neural network can optimize itself constantly to enhance accuracy and efficiency of operational analysis, and thus detecting the state categories in the circuit to be detected by utilizing the neural network can enhance accuracy of the detection. Furthermore, in the process of detecting the state category of the circuit to be detected, the state category in the circuit to be detected can be obtained only by inputting the electrical characteristic parameters of a part of nodes in the circuit to be detected to the neural network. That is, the operating state of the circuit to be detected may be obtained without performing operations such as microscope detection, TFT Characteristic testing or SEM splicing on the circuit to be detected, which greatly saves the time, and reduces complexity due to manual analysis work. Therefore, the detection method for the operating state of the circuit provided in the embodiments is capable of detecting the operating state of the circuit accurately and quickly.

It needs to be specified that "forming a neural network that acquires a state category of a circuit to be detected" mentioned in step S1 may include acquiring the neural network based on the structure of the circuit, or acquiring the neural network using the existing neural network. Furthermore, when the neural network is obtained based on the structure of the circuit, the neural network may be obtained according to the structure of the circuit to be detected itself, or may be obtained according to a structure of other circuits which have a same structure as the circuit to be detected.

It needs to be specified that the electrical characteristic parameters of the node may be a node voltage parameter, a node current parameter or node power parameter of the node, and of course, may be other electrical characteristic parameters that can be received by the neural network, to which the present disclosure does not limit.

It could be understood that a normal state included in the state categories refers to a state where the circuit to be detected has no fault and runs normally.

Figure 2:
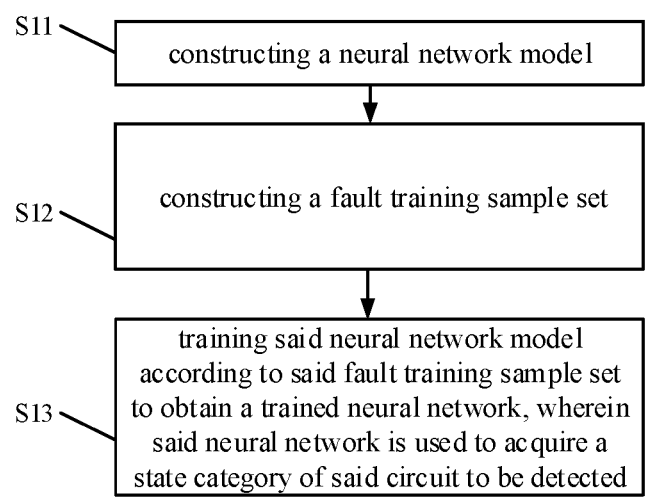
FIG. 2 is a second flow chart of a detection method for an operating state of a circuit provided in a first embodiment of the present disclosure.

As shown in FIG. 2, step S1 can in particular comprise: step S11, constructing a neural network model; step S12: constructing a fault training sample set, wherein the fault training sample set can comprise a plurality of state categories and electrical characteristic parameters of at least one node in the circuit to be detected corresponding to each state category of the plurality of state categories, and the plurality of state categories can comprise a normal state and at least one fault state of the circuit to be detected; and step S13, training the neural network model according to the fault training sample set to obtain a trained neural network, wherein the trained neural network is used to acquire the state category of the circuit to be detected.

Herein, training the neural network model according to the fault training sample set refers to that the plurality of state categories in the fault training sample set and the electrical characteristic parameters of at least one node in the circuit to be detected corresponding to each state of the plurality of state categories are input into the neural network so that the neural network correctly knows a correspondence relationship between the electrical characteristic parameters of the at least one node and the state categories. Thus, after training of the neural network is completed, and when the electrical characteristic parameters of at least one node in the circuit to be detected is input to the neural network, the trained neural network can accurately output a state category corresponding to the input electrical characteristic parameters of at least one node.

The process of training the neural network model can also be called as a learning process of the neural network model. By training the neural network model, it can make that the trained neural network has a stronger generalization capability, and thus obtains a correct input/output mapping relationship, so that it is capable of further increasing accuracy of operation and analysis of the neural network.

Herein, step S11 can in particular comprise: constructing a probabilistic neural network model according to a newpnn( ) function in a Matlab neural network toolbox used for designing the neural network model. Herein, the constructed probabilistic neural network model is used to acquire the state category of the circuit to be detected. The probabilistic neural network model comprises an input node, an output node and an input/output control algorithm.

Assuming that the circuit to detected comprises N nodes, when the probabilistic neural network model is trained in subsequent process, for example, electrical characteristic parameters of N nodes corresponding to each state category of the plurality of state categories can be combined into an N-dimensional vector to be input to the probabilistic neural network model. Therefore, the number of the input nodes of the constructed probabilistic neural network model needs to equate to the number of dimensions N of the input vector, that is, the number of the input nodes of the probabilistic neural network model equates to the number of nodes in the circuit to be detected.

By training the probabilistic neural network model utilizing the electrical characteristic parameters of the N nodes, it can be further guaranteed that the trained probabilistic neural network has a correct input/output mapping relationship. Of course, electrical characteristic parameters of only a part of nodes of the N nodes are input to the probabilistic neural network model. At this time, the number of the input nodes of the probabilistic neural network model is smaller than the number of nodes in the circuit to be detected.

Figure 3:
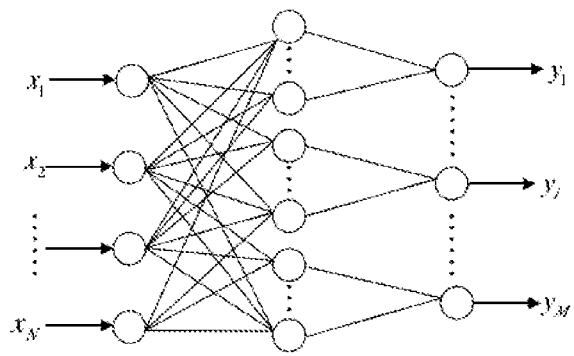
FIG. 3 is a schematic diagram of a topology structure of a probabilistic neural network model provided in a first embodiment of the present disclosure.

Assuming that the circuit to be detected has totally M state categories, in order to guarantee that it is capable of outputting any one state category of all the state categories by utilizing the probabilistic neural network, in one example, the number of output nodes of the constructed probabilistic neural network model should equate to the number M of the state categories in the circuit to be detected, that is, the number of the output nodes of the probabilistic neural network model equates to the number of the state categories in the circuit to be detected. In particular, as shown in FIG. 3, the probabilistic neural network model has N input nodes: $x_1 \sim x_N$, and M output nodes: $y_1 \sim y_M$.

In the detection method for the operating state provided in the embodiment, the constructed neural network model is a probabilistic neural network model. Compared with a conventional BP neural network model, the probabilistic neural network model is a parallel algorithm developed from Bayes minimum risk, and has advantages of short training time, being not easy to convergent to local optimum and being appropriate fix mode classification. Therefore, detecting the state categories of the circuit to be detected based on the probabilistic neural network model is capable of further reducing the detection time and improving accuracy of detection.

In one example, the step S12 can in particular comprise: setting the circuit to be detected according to each state category of the plurality of state categories, and measuring electrical characteristic parameter(s) of at least one node in the set circuit to be detected; and constructing a fault training sample set according to the plurality of state categories and the electrical characteristic parameter(s) of at least one node corresponding to each state category of the plurality of state categories.

The state categories of the circuit can comprise a normal state and at least one fault state of the circuit to be detected, wherein the fault state commonly comprises a hard fault state and a soft atilt state. Therefore, the fault training sample set constructed in step S12 can in particular comprise at least one of a hard fault training sample set and a soft fault training sample set. On such a basis, the step of "setting the circuit to be detected according to each state category of the plurality of state categories can in particular comprise at least one of the following operations:

if the plurality of state categories comprise at least one hard fault state category, setting an element(s) in the circuit to be detected corresponding to each hard fault state category of at least one hard fault state category as a short circuit state or an open circuit state; in this case, then, acquiring an electrical characteristic parameter(s) of at least one node in the circuit to be detected corresponding to each hard fault state category of at least one hard fault state category; constructing a hard fault training sample set according to the at least one hard fault state category and the electrical characteristic parameter(s) of at least one node corresponding to each hard fault state category of at least one hard fault state category;

And, when the plurality, of state categories comprise at least one soft fault state category, setting a parameter(s) of an element(s) in the circuit to be detected corresponding to each fault state category of the at least one soft fault state category to exceed its tolerance range, and, for example, performing a Monte Carlo transient analysis on the set circuit to be detected through a PSPICE software; in this case, then, acquiring an electric characteristic parameter(s) of the at least one node in the circuit to be detected corresponding to each soft fault state category of the at least one soft fault state category, constructing a soft fault training sample set according to the at least one soft fault state category and the electrical characteristic parameter(s) of the at least one node corresponding to each soft fault state category of the at least one soft fault state category.

It needs to be specified that besides simulating hard faults of the circuit by means of software, short circuit or open circuit of the element can be set artificially by utilizing a device such as a laser cutting device. Moreover, when the node voltage is being acquired, the Monte Carlo transient analysis can be performed on the set circuit to be detected by adopting a PSPICE software to acquire the electrical characteristic parameter(s) of the at least one node in the circuit to be detected corresponding to each state category of the plurality of state categories.

It needs to be specified that the PSPICE software is a simulation software having strong circuit diagram drawing function, circuit simulation function, graphic post-processing function and element and device symbol designing function. Performing the Monte Carlo transient analysis on the set circuit to be detected by utilizing the PSPICE software can achieve great simulation analysis effect.

Figure 4:
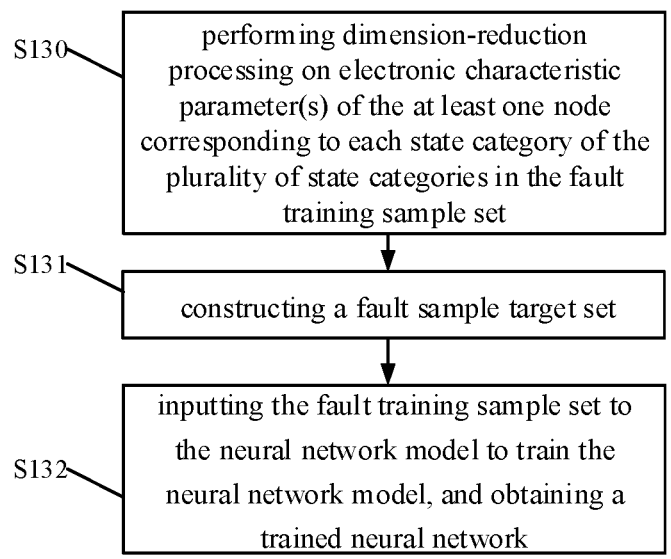
FIG. 4 is a third flow chart of a detection method for an operating state provided in a first embodiment of the present disclosure.

As shown in FIG. 4, the step S13 can in particular comprise: in step S131, constructing a fault sample target set. Herein, the fault sample target set is a corresponding relationship between a binary code output by the neural network and the plurality of state categories.

Exemplarily, the circuit to be detected can comprise three state categories, such as a state category A, a state category B and a state category C, and the neural network comprises three output nodes, and each output node outputs a series of binary codes. The fault sample target set includes: a binary code output by a neural network output 100 corresponding to the state category A, a binary code of a neural network output 010 is corresponding, to the state category B, and a binary code of a neural network output 001 is corresponding to the state category C.

Next, in step S132: the fault training sample set is input to the neural network model to train the neural network model, and a trained neural network is obtained. The trained neural network needs to satisfy: when a currently measured electrical characteristic parameter of at least one node is input to the trained neural network, a state category to which a binary code output by the trained neural network is corresponding in the fault sample target set is consistent with a state category where the current circuit to be detected is actually in.

Exemplarily, electrical characteristic parameters of respective nodes corresponding to the state category A are input to the trained neural network, and the binary code output by the trained neural network shall be 100; electrical characteristic parameters of respective nodes corresponding to the state category B are input to the trained neural network, and the binary code output by the trained neural network shall be 010; electrical characteristic parameters of respective nodes corresponding to the state category C are input to the trained neural network, and the binary code output by the trained neural network shall be 001.

In order to exclude mutually-overlapped information among various information included in the fault training sample set, referring to FIG. 4 again, prior to the step S131, the detection method for the operation state of the circuit provided in the embodiment can further comprise: step S130: performing dimension-reduction processing on the electrical characteristic parameter data of at least one node corresponding to each state category of the plurality of state categories in the fault training sample set. In particular, dimension-reduction processing can be performed on the electrical characteristic parameter data in the fault training sample set by utilizing the principal component analysis (hereinafter referred to as PCA).

Figure 5:
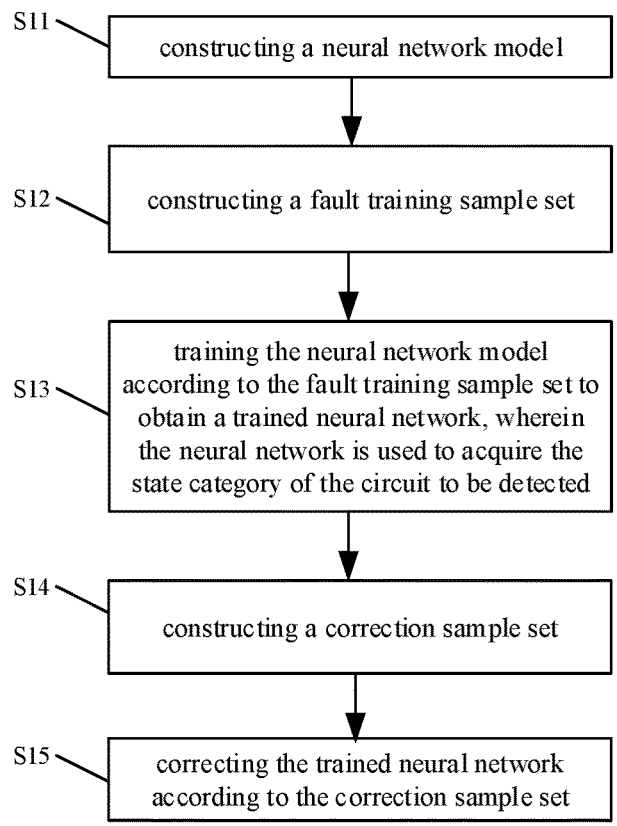
FIG. 5 is a fourth flow chart of a detection method for an operating state of a circuit provided in a first embodiment of the present disclosure.

Additionally, as shown in FIG. 5, step S1 can further comprise: in step S14, constructing a correction sample set. Herein, the correction sample set comprises a plurality of state categories and an electrical characteristic parameter(s) of at least one node in the circuit to be detected corresponding to each state category of the plurality of state categories; and in step S15, correcting the trained neural network according to the correction sample set.

It needs to be noted that the step of constructing a correction sample set is executed after the step S13 just for illustrative description. In the actual application, the step of constructing the correction sample set and the step of constructing the fault training sample set can be performed simultaneously.

In particular, the correction sample set can comprise at least one of a hard fault correction sample set and a soft fault correction sample set. When the neural network model is trained by using only the hard fault training sample set, correspondingly, the trained neural network can be corrected through the hard fault correction sample set. When the neural network model is trained by using only the soft fault training sample set, correspondingly, the trained neural network can be corrected through the soft fault correction sample set. When the neural network model is trained by using both the hard fault training sample set and the soft fault training sample set simultaneously, correspondingly, the trained neural network can be corrected through at least one of the hard fault correction sample set and the soft fault correction sample set.

On such a basis, the step S14 can in particular comprise: setting the circuit to be detected according to each state category of the plurality of state categories, and measuring the electrical characteristic parameter(s) of at least one node in the set circuit to be detected; and constructing the correction sample set according to the plurality of state categories and the electrical characteristic parameter(s) of at least one node corresponding to each state category of the plurality of state categories.

In particular, the step of "setting the circuit to be detected according to each state category of the plurality of state categories" can comprise at least one of following operations: if the plurality of state categories comprise at least one hard fault state category, setting an element in the circuit to be detected corresponding to each hard fault state category of at least one hard fault state category as a short circuit state or an open circuit state; and if the plurality of state categories comprise at least one soft fault state category, setting a parameter of an element in the circuit to be detected corresponding to each soft fault state category of at least one soft fault state categories to exceed its tolerance range, for example, performing a Monte Carlo transient analysis on the set circuit to be detected through the PSPICE software.

It needs to be specified that besides simulating the hard fault of the circuit by means of software, short circuit or open circuit of the element can be set artificially by utilizing a device such as a laser cutting device. Moreover, when the node voltage is being acquired, the Monte Carlo transient analysis can be performed on the set circuit to be detected by the PSPICE software to acquire the electrical characteristic parameter(s) of at least one node in the circuit to be detected corresponding to each state category of the plurality of state categories, or to acquire the electrical characteristic parameter by means of actual measurement, Step S15 can in particular comprise: inputting an electrical characteristic parameter(s) of at least one node in the correction sample set corresponding to each state category of the plurality of state categories into the trained neural network, so that the trained neural network outputs a binary code, comparing a correspondence relationship between the output binary code and the state category corresponding to the input electrical characteristic parameter(s) of at least node in the correction sample set with the fault sample target set, and determining whether an output result of the neural network is accurate. For example, an accuracy rate of the output result of the neural network can be compared with a predetermined threshold value. If the accuracy rate is higher than or equal to the threshold value, then it is determined that the output result of the neural network is accurate, and the trained neural network can be used to detect faults of the circuit to be detected; if the accuracy rate is lower than the threshold value, then it is determined that the output result of the neural network is inaccurate, and at this time, the trained neural network needs to be re-trained.

Based on the above description, by testing the trained neural network through the correction sample set, accuracy can be determined when the neural network detects the operating state of the circuit to be detected. If it is determined as inaccurate, the trained neural network needs to be re-trained, until the re-trained neural network accurately detects the faults of the circuit to be detected.

The detection method is applicable to various circuits, for example, a resistance circuit, a single-stage circuit of a LIPS product. The detection method of the operating state of the circuit will be described in detail by taking the structure of the circuit as shown in FIGS. 6 and 7 as an example.

Figure 6:
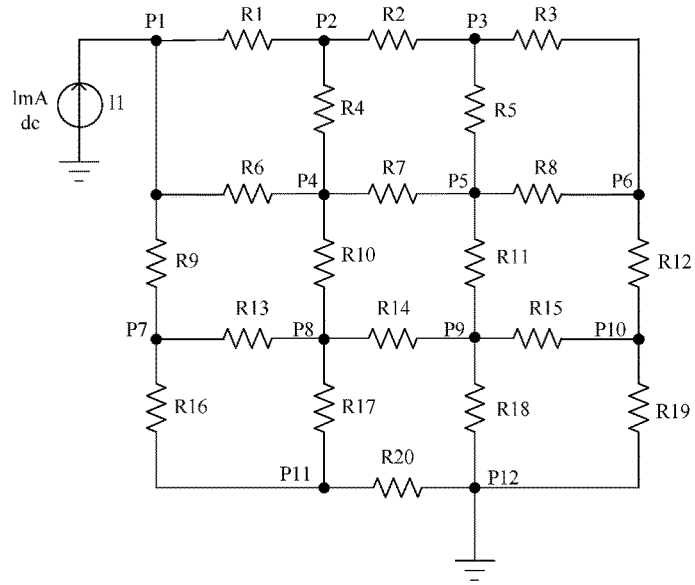
FIG. 6 is a schematic diagram of a structure of a resistance circuit provided in a first embodiment of the present disclosure.
Figure 7:
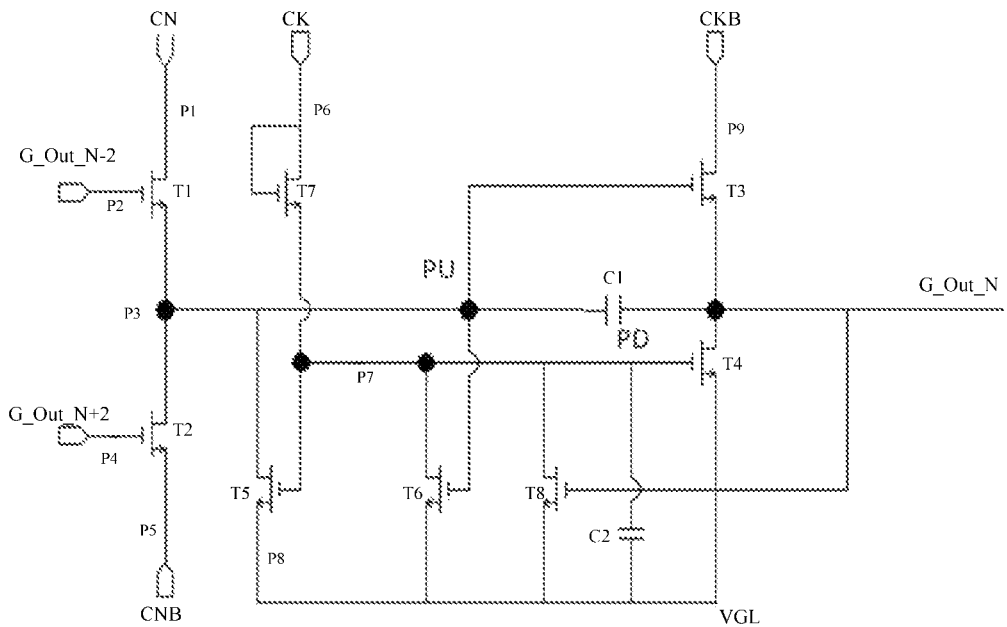
FIG. 7 is a schematic diagram of a structure of a GOA circuit provided in a first embodiment of the present disclosure.

The circuit as shown in FIG. 6 comprises 20 resistors (R1~R20), and 12 nodes (P1~P12). It is assumed that the circuit comprises 8 state categories: one normal state and seven fault states, wherein the seven fault states comprise R1+40%, R1−50%, R6 open circuit, R9 short circuit, R18 open circuit, R20+50%, R19+50% and R20 open circuit. By taking R1+40% and R1−50% as an example, R1+40% represents that a parameter value of R1 is higher than 40% of the tolerance range, R1−50% represents that a parameter value of R1 is lower than 40% of the tolerance range, which both belong to software faults.

Step H1: constructing a probabilistic neural network model, wherein the probabilistic neural network comprises 6 output nodes, 8 output nodes and input/output control algorithms.

Step H2: for each state category of 8 state categories, performing the Monte Carlo transient analysis for 30 times, and acquiring voltages of nodes P2, P5, P6, P8, P9, P11 in the circuit to be detected under each state category. Herein, node voltages of 6 nodes in the circuit to be detected acquired by performing the Monte Carlo transient state analysis for 20 times are used to construct the fault training sample set, and node voltages of 6 nodes in the circuit to be detected acquired by performing the Monte Carlo transient analysis for 10 times are used to construct the correction sample set. It shall be known that for the circuit to be detected under each state category, voltages of nodes acquired by performing the Monte Carlo for a plurality of times are different or not the same completely, and thus the result of the Monte Carlo analysis for a plurality of times can form a plurality of samples.

It needs to be specified that when the fault training sample set is constructed, since the Monte Carlo transient state analysis is performed on each state category of 8 state categories for 20 times, the fault training sample set comprises 160 fault training samples. For the same reason, when the correction sample set is constructed. Since the Monte Carlo transient state analysis is performed on each state category of 8 state categories for 10 times, the correction sample set comprises 80 correction samples.

Step H3: by utilizing a PCA algorithm, performing dimension-reduction processing on node voltage data of 6 nodes corresponding to each of the 8 state categories included in the fault training sample set. Herein, a part of codes of the PCA algorithm in the Matlab environment is as shown below:

```
samplemean=mean(allsamples); % taking a mean value of a sample matrix
column=0;
for j=1:m % normalization of the sample matrix
    for i=1:n
        column=column+(allsamples(i,j)-samplemean(1,j))^2;
    end
    Sj(1,j)=column/(n-1);
    column=0;
end
for j=1:m
    for i=1:n
all(i,j)=(allsamples(i,j)-samplemean(1,j))/((Sj(1,j))^0.5);
    end
end
[n,p]=size(all); % calculating a covariance matrix
all=all-ones(n,1)*mean(all);
cov=all'*all/(n-1);
sigma=(cov'*cov)/(n-1); % calculating a characteristic value
and a characteristic vector [v d]=eigs(sigma);
d1=diag(d);
[d2 index]=sort(d1);% ordering the characteristic value
cols=size(v,2);
for i=1:cols
    vsort(:,i)=v(:,index(cols-i+1));
    dsort(i)=d1(index(cols-i+1));
end
dsum=sum(dsort); % calculating a contribution rate of
principal components
    dsum_extract=0;
    p=0;
    while(dsum_extract/dsum<0.85)
        p=p+1;
        dsum_extract=sum(dsort(1:p));
    end
```

Step 144: constructing the fault sample target set, wherein the correspondence relationship between the binary code output by the probabilistic neural network and the state category is as shown in Table 1:

TABLE 1

| Output nodes of probabilistic neural network | | | | | | | | State category |
|---|---|---|---|---|---|---|---|---|
| 1 | 2 | 3 | 4 | 5 | 6 | 7 | 8 | |
| 1 | 0 | 0 | 0 | 0 | 0 | 0 | 0 | Normal |
| 0 | 1 | 0 | 0 | 0 | 0 | 0 | 0 | R1 + 40% |
| 0 | 0 | 1 | 0 | 0 | 0 | 0 | 0 | R1 − 50% |
| 0 | 0 | 0 | 1 | 0 | 0 | 0 | 0 | R6 open cirucit |
| 0 | 0 | 0 | 0 | 1 | 0 | 0 | 0 | R9 short circuit |
| 0 | 0 | 0 | 0 | 0 | 1 | 0 | 0 | R18 open circuit |
| 0 | 0 | 0 | 0 | 0 | 0 | 1 | 0 | R20 + 50% |
| 0 | 0 | 0 | 0 | 0 | 0 | 0 | 1 | R19 + 50%, R20 open circuit |

Step H5: inputting the fault training sample set on which the dimension-reduction processing has been performed into the probabilistic neural network model, and training the probabilistic neural network model to obtain the trained probabilistic neural network. Herein, a part of codes fair realizing training the probabilistic neural network model in the Matlab environment are as shown below:

t1=clock; % time starts
net=newpnn (p,t,spread); % p is an input vector, t is a target vector, a value of spread is 0.1
data=etime (clock,t1); % a trained neural network is stored save net2 net;

Step H6: extracting node voltage data of 6 nodes corresponding to the four state categories R−50%, R9 short circuit, R18 open circuit and R20+50% from the correction sample set respectively and correcting the trained neural network.

Herein, node voltage data of 6 nodes corresponding to the four state categories R1−50%, R9 short circuit, R18 open circuit and R20+50% is as shown in Table 2:

TABLE 2

| P2 | P5 | P6 | P8 | P9 | P11 | State category |
|---|---|---|---|---|---|---|
| 4.3491 | 3.1776 | 2.7966 | 3.2949 | 2.5171 | 2.9567 | R1 − 50% |
| 4.1771 | 3.3255 | 2.8933 | 3.9142 | 2.8470 | 3.7100 | R9 short cicuit |
| 4.0867 | 3.2338 | 2.8309 | 3.3183 | 2.8341 | 2.7899 | R18 open circuit |
| 4.0937 | 3.1390 | 2.7445 | 3.3669 | 2.6096 | 3.1128 | R20 + 50% |

The node voltages of 6 nodes corresponding to the state category R1−50% are input to the trained probabilistic neural network respectively, and the binary code output by the probabilistic neural network is 00100000; node voltages of 6 nodes corresponding to the state category R9 short circuit are input to the trained probabilistic neural network respectively, and the binary code output by the probabilistic neural network is 00001000; node voltages of 6 nodes corresponding to the state category R18 open circuit are input to the trained probabilistic neural network, and the binary code output by the probabilistic neural network is 00000100; node voltages of 6 nodes corresponding to the state category R20+50% are input to the trained probabilistic neural network, and the binary code output by the probabilistic neural network is 00000010.

By comparing the binary codes output by the trained probabilistic neural network with the correspondence relationship in Table 1, it can be found that the state category corresponding to the binary code output by the trained probabilistic neural network in Table 1 is consistent with the state category actually corresponding to the node voltages of 6 nodes in Table 2. Thus, it can be seen that the output result of the trained probabilistic neural network is accurate, and it can be directly used to detect the operating state of the circuit to be detected subsequently.

In particular, a part of codes for correcting by using the neural network in the Matlab environment are as follows:

load net2 net; % loading the trained neural network
y=sim (net,p_test); % classifying a sample to be detected p_test
yc=vec2ind(y); % a result is transformed into a row vector Step H7: measuring node voltages of nodes P2, P5, P6, P8, P9, P11 in the circuit.

Step H8: inputting measured node voltages into the trained probabilistic neural network and obtaining the state category of the circuit through the probabilistic neural network.

As described above, the detection method of the operating state of the circuit according to the embodiment of the present disclosure can be further applied to the GOA circuit. There are many types of display defects reflected on the display panel (LCD) for the damages of the GOA circuit, for example, black screen of display, split screen of display, mess-up screen of display, and bright line at the bottom, etc. Obviously, each display defect is corresponding, to non-normal operating state of internal devices in the circuit. By taking FIG. 7 as an example, the single-stage GOA circuit comprises 8 transistors and 2 capacitors. It is assumed that the circuit comprises one normal state and four fault states. The fourth fault states are T1 open circuit, T3 open circuit, C1+50%, T4 current toff increase in a turn-off state. Herein T1 open circuit and T3 open circuit are hard faults, and C1+50% and T4 Ioff increase are soft faults. According to the operation principle of the GOA circuit, in the GOA circuit as shown in FIG. 7, external performance of the T1 open circuit is black screen of display, external performance of T3 open circuit is split screen of display, external performance of C1+50% is mess-up screen of display, and external performance of T4 Ioff is bright line at the bottom.

When the fault training sample set and the correction sample set are constructed, it is necessary to collect the electrical characteristic parameter(s) of at least one node in the circuit under each state category. For the two hard faults of the four fault states as well as the normal state, the test can be performed by using actual TFT-LCD product. The specific method is to use Laser cutting to break down the corresponding components in the GOA circuit on the TFT-LCD product, that is, the corresponding fault can be simulated. Then, voltage values of nodes P1-P9 in the GOA circuit as shown in FIG. 7 are acquired by utilizing a laser probe device and an oscilloscope. For the two soft faults of the above fault state categories, the training sample set and the correction sample set can be obtained by using the Monte Carlo analysis according to the simulation method of the resistance circuit, details omitted herein.

Then, the above simulation data is input to the neural network model (for example, probabilistic neural network model PNN) to train and test the neural network model, so as to obtain the trained neural network. Of course, as described above, before being input into the neural network model, the above simulation data can be dimension-reduction firstly by using the PCA algorithm.

After that, when similar bad display conditions occurs, as described above, voltage value data of corresponding nodes in the GOA circuit are acquired by using the laser probe device and the oscilloscope. And a fault diagnosis is performed by inputting the acquired voltage value data of nodes to the trained neural network.

There is provided in an embodiment of the present disclosure a detection apparatus for an operating state of a circuit. The apparatus is corresponding to the detection method for the operating state of the circuit provided in the first embodiment.

Figure 8:
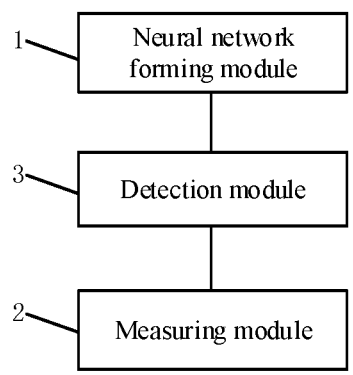
FIG. 8 is a first schematic diagram of a structure of a detection apparatus for an operating state of a circuit provided in a second embodiment of the present disclosure.

As shown in FIG. 8, the detection apparatus for the operating state of the circuit provided in the embodiment comprises a neural network forming module 1, a measuring module and a detection module 3. Herein, the neural network forming module 1 is configured to form a neural network for acquiring a state category of a circuit to be detected. The measuring module 2 is configured to measure an electrical characteristic parameter(s) of at least one node in the circuit to be detected. The detection module 3 is connected to the neural network forming module 1 and the measuring module 2, respectively, and configured to acquire the neural network and an electrical characteristic parameter(s) of at least one node in the circuit to be detected, input the measured electrical characteristic parameter(s) of at least one node into the neural network, and obtain the state category of the circuit to be detected through the neural network.

The detection apparatus of the operating state of the circuit provided in the embodiment comprises the neural network forming module 1. Therefore, detecting the state category of the circuit to be detected by utilizing the neural network is capable of raising accuracy of the detection. By adopting the detection apparatus for the operating state of the circuit provided in the embodiment, the state category in the circuit to be detected can be obtained only if the electrical characteristic parameter(s) of a part of nodes in the circuit to be detected is input to the neural network, i.e., acquiring the operating state of the circuit to be detected, without performing operations such as microscope detection, TFT characteristic testing or SEM splicing on the circuit to be detected, which greatly saves the time. Therefore, by adopting the detection apparatus for the operating state of the circuit provide in the present embodiment, it is capable of detecting the operating state in the circuit accurately and quickly.

It needs to be specified that the electrical characteristic parameter(s) of the nodes can in particular be a node voltage parameter, a node current parameter or a node power parameter of the nodes. Of course, it can also be other electrical characteristic parameters that can be received by the neural network.

Figure 9:
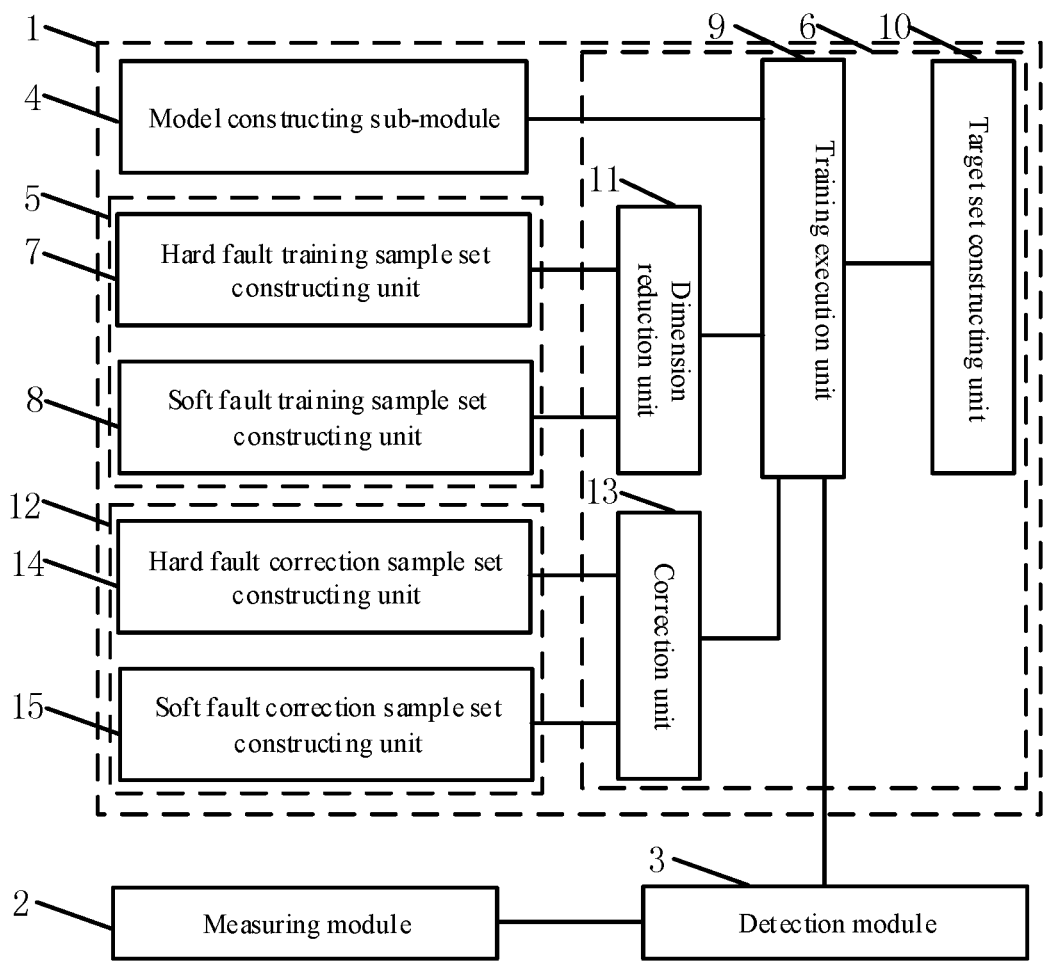
FIG. 9 is a second schematic diagram of a structure of a detection apparatus for an operating state of a circuit provided in a second embodiment of the present disclosure.

In particular, as shown in FIG. 9, the neural network forming module 1 comprises a model constructing sub-module 4, a training sample set constructing sub-module 5, and a training sub-module 6 connected to the model constructing sub-module 4, the training set constructing sub-module 5 and the detection module 3 respectively. The model constructing sub-module 4 is configured to construct the neural network model. The training sample set sub-module 5 is configured to construct the fault training sample set. The training sub-module 6 is configured to acquire a fault training sample set and a neural network model and train the neural network model according to the fault training sample set to obtain a trained neural network.

By training the neural network model, a generalization capability of the trained neural network can be made strong, and a correct input/output mapping relationship can be obtained, so that accuracy of operational analysis of the neural network can be further enhanced.

In one example, the model constructing sub-module 4 is used to construct a probabilistic neural network model. Herein, the constructed probabilistic neural network model comprises an input node, an output node and an input/output control algorithm. Compared with a conventional BP neural network model, the probabilistic neural network model has advantages of short training time, being not easy to convergent to local optimum and being appropriate for mode classification. Therefore, detecting the state categories of the circuit to be detected by using the probabilistic neural network model is capable of further reducing the time spent on detection and raising accuracy of the detection.

The state category of the circuit comprises a normal state and fault state(s), wherein the fault states generally comprise two states, i.e., hard fault and soft, fault. Therefore, the training sample set constructing sub-module 5 can comprise at least one of a hard fault training sample set constructing unit 7, which is connected to the training sub-module 6, and a soft fault training sample set, which is connected to the training sub-module 6.

Herein, the hard fault training sample set constructing unit 7 is configured to construct the hard fault training sample set. The constructed hard fault training sample set comprises at least one hard fault state category, and the electrical characteristic parameter(s) of at least one node in the circuit to be detected corresponding to each hard fault state category of at least one hard fault state category. The soft fault training sample set constructing unit 8 is configured to construct the soft fault training sample set. The constructed soft fault training sample set comprises at least one soft fault state category, and the electrical characteristic parameter(s) of the at least one node in the circuit to be detected corresponding to each soft fault state category of the at least one soft fault state category.

The training sub module 6 comprises a target set constructing unit 9 and a training execution unit 10. Herein, the target set constructing unit 9 is configured to construct the fault sample target set. The training execution unit 10 is connected to the detection module 3, the target set constructing unit 9, the model constructing sub-module 4, and the training sample set constructing sub-module 5 (at least one of the hard fault training sample set constructing unit 7 and the soft fault training sample set constructing unit 8) respectively, and is configured to acquire the fault sample target set, the neural network model, and at least one of the hard fault training sample set and the soft fault training sample set. The training execution unit 10 inputs at least one of the hard fault training sample set and the soft fault training sample set into the neural network model and trains the neural network according to the fault sample target set to obtain the trained neural network.

Additionally, the training sub-module 6 can further comprise a dimension-reduction unit 11 connected to the training execution unit 10 and the training sample set constructing sub-module 5 (at least one of the hard fault training sample set constructing unit 7 and the soft fault training sample set constructing unit 8) respectively. The dimension-reduction unit 11 is configured to perform dimension-reduction processing on the electrical characteristic parameter data of at least one node corresponding to each state category of the plurality of state categories in the fault training sample set, so as to exclude mutually-overlapped information various information included in the fault training sample set.

The neural network forming module 1 can further comprise a correction sample set constructing sub-module 12 configured to construct a correction sample set. The correction sample set comprises the plurality of state categories and the electrical characteristic parameter(s) of at least one node in the circuit to be detected corresponding to each state category of the plurality of state categories.

The training sub-module 6 can further comprise a correction unit 13 connected to the correction sample set constructing sub-module 12 and the training execution unit 10 respectively. The correction unit 13 is configured to correct the trained neural network according to the correction sample set.

By configuring the correction unit 13, the trained neural network can be tested according to the correction sample set, and accuracy can be determined when the neural network detects the operating state on the circuit to be detected. If it is determined as inaccurate, it is necessary to re-train the neural network whose training has been completed until the re-trained neural network detects the faults of the circuit to be detected.

The correction sample set constructing sub-module 12 in particular comprises at least one of a hard limit correction sample set constructing unit 14 and a soft fault correction sample set constructing unit 15, which are connected to the correction unit 13.

Herein, the hard fault correction sample set constructing unit 14 is configured to construct a hard fault correction sample set. The constructed hard fault training sample set comprises at least one hard fault state category, and the electrical characteristic parameter(s) of at least one node in the circuit to be detected corresponding to each hard fault stage category of at least one hard fault state categories. The soft fault correction sample set constructing unit 15 is configured to construct a soft fault correction sample set. The constructed soft limit training sample set comprises at least one soft fault state category, and the electrical characteristic parameter(s) of at least one node in the circuit to be detected corresponding to each soft fault state category of at least one soft fault state category.

Respective modules, sub-modules and units included in the detection apparatus of the operating state of the circuit as described above can be realized by using one or more processors, and they can further comprise one or more memories for storing computer instructions. When the computer instructions are ran, the processor executes one or more steps or functions in the embodiment.

The memory can be realized by various volatile or non-volatile memory devices of any type or combination thereof, such as a static random access memory (SRAM), an electrically erasable programmable read-only memory (EE-PROM), an erasable programmable read-only memory (EPROM), a programmable read-only memory (PROM), a read-only memory (ROM), a magnetic memory, a flash memory, a magnetic disk or an optical disk.

The processor can be logic operation device having data processing capability and/or program executing capability such as a central processing unit (CPU) or a field programmable gate array (FPGA) or a micro controller unit (MCU) or a digital signal processor (SDP) or a specific integrated circuit (ASIC) or a graphic processing unit (GPU).

The computer instructions comprise one or more processor operations defined by an instruction set architecture corresponding to processors. These computer instructions can be included and represented logically by one or more computer programs.

The above descriptions are only implementations of the present disclosure, but the protection scope of the present disclosure is not limited thereto. Any alternation or replacement that can be easily conceived by those skilled in the art who are familiar with the present technical field within the technical scope disclosed in the present invention shall be covered within the protection scope of the claims.

What is claimed is:

1. A detection method for an operating state of a circuit, comprising:
    forming a neural network that acquires a state category of a circuit to be detected;
    measuring electrical characteristic parameters of at least one node in said circuit to be detected;
    inputting the measured electrical characteristic parameters of at least one node to said neural network, and obtaining the state category of said circuit to be detected through said neural network;
    wherein forming the neural network that acquires the state category of a circuit to be detected comprises:
    constructing a neural network model;
    constructing a fault training sample set, wherein said fault training sample set comprises a plurality of state categories and the electrical characteristic parameters of at least one node in said circuit to be detected corresponding to each state category of the plurality of state categories, and said plurality of state categories comprise a normal state and at least one fault state of said circuit to be detected;
    constructing a fault sample target set, wherein said fault sample target set is a correspondence relationship between a binary code output by said neural network and said plurality of state categories;
    inputting said fault training sample set to said neural network model to train said neural network model, to acquire the trained neural network according to said fault sample target set, wherein said neural network is used to acquire the state category of said circuit to be detected.

2. The detection method for the operating state of the circuit according to claim 1, wherein constructing the fault training sample set comprises:
    setting said circuit to be detected according to each state category of said plurality of state categories, and measuring the electrical characteristic parameters of at least one node in the set circuit to be detected;
    constructing the fault training sample set according to said plurality of state categories and the electrical characteristic parameters of at least one node corresponding to each state category of said plurality of state categories.

3. The detection method for the operating state of the circuit according to claim 2, wherein setting said circuit to be detected according to each state category of said plurality of state categories comprises at least one of following operations:
    when said plurality of state categories comprise at least one hard fault state category, setting an element in said circuit to be detected corresponding to each hard fault state category of said at least one hard fault state category as a short circuit state or an open circuit state; and
    when said plurality of state categories comprise at least one soft fault state category, setting a parameter of an element in said circuit to be detected corresponding to each soft fault state category of said at least one soft fault state category as exceeding its tolerance range, and performing a Monte Carlo transient analysis on said set circuit to be detected.

4. The detection method for the operating state of the circuit according to claim 1, wherein before constructing the fault sample target set, said method further comprises:
    performing dimension-reduction processing on electrical characteristic parameter data of at least one node corresponding to each state category of said plurality of state categories in said fault training sample set.

5. The detection method of the operating state of the circuit according to claim 1, wherein forming the neural network that acquires the state category of said circuit to be detected comprises: constructing a correction sample set, wherein said correction sample set comprises a plurality of state categories and electrical characteristic parameters of at least one node in said circuit to be detected corresponding to each state category of said plurality of state categories;
    after training said neural network model according to a fault training sample set to obtain the trained neural network, further comprising: correcting the trained neural network according to said correction sample set.

6. The detection method for the operating state of the circuit according to claim 5, wherein constructing the correction sample set comprises:
    setting said circuit to be detected according to each state category of said plurality of state category, and measuring the electrical characteristic parameters of at least one node in a set circuit to be detected;
    constructing the correction sample set according to said plurality of state categories and the electrical characteristic parameters of at least one node corresponding to each state category of said plurality of state categories.

7. The detection method for the operating state of the circuit according to claim 6, wherein setting said circuit to be detected according to each state category of said plurality of state categories comprises at least one of following operations:
    when said plurality of state categories comprise at least one hard fault state category, setting an element in said circuit to be detected corresponding to each hard fault state category of said at least hard fault state category as a short circuit state or an open circuit state; and,
    when said plurality of state categories comprise at least one soft fault state category, setting a parameter of an element in said circuit to be detected corresponding to each soft fault state category of said at least one soft fault state category as exceeding its tolerance range, and performing a Monte Carlo transient analysis on a set circuit to be detected.

8. The detection method for the operating state of the circuit according to claim 5, wherein correcting the trained neural network according to said correction sample set comprises:
    inputting the electrical characteristic parameters of at least one node in said correction sample set corresponding to each state category of said plurality of state categories into the trained neural network, so that the trained neural network outputs a binary code, comparing a correspondence relationship between the output binary code and a state category in said correction sample set corresponding to the electrical characteristic parameters of said at least one node with said fault sample target set, determining whether the output of said neural network is accurate, and if it is determined as accurate, then the trained neural network is used to perform fault detection on said circuit to be detected; if it is determined as inaccurate, then the trained neural network is re-trained.

9. A detection apparatus for an operating state of a circuit, comprising:
a neural network forming module, configured to form a neural network that acquires a state category of a circuit to be detected;
a measuring module, configured to measure electrical characteristic parameters of at least one node in said circuit to be detected;
a detection module connected to said neural network forming module and said measuring module respectively, and configured to acquire said neural network and the electrical characteristic parameters of at least one node in said circuit to be detected, input acquired electrical characteristic parameters of at least one node to said neural network, and obtain the state category of said circuit to be detected through said the neural network;
wherein said neural network forming module comprises:
a model constructing sub-module, configured to construct a neural network model;
a training sample set constructing sub-module, configured to construct a fault training sample set;
a training sub-module, connected to said module constructing sub-module, said training sample set constructing sub-module and said detection module respectively, and configured to acquire said fault training sample set and said neural network model, train said neural network model according to said fault training sample set to obtain a trained neural network;
said training sub-module comprises:
a target set constructing unit, configured to construct a fault sample target set, said fault sample target set being a correspondence relationship between a binary code output by said neural network and said plurality of state categories;
a training execution unit, connected to said detection module, said target set constructing unit, said model constructing sub-module and said training sample set constructing sub-module respectively, and configured to acquire said fault sample target set and said neural network model, input said fault training sample set to said neural network model, and train said neural network according to said fault sample target set to obtain a trained neural network.

10. The apparatus for the operating state of the circuit according to claim 9, wherein,
said training sample set constructing sub-module comprises at least one of a hard fault training sample set constructing unit and a soft fault training sample set constructing unit connected to said training sub-module,
wherein said hard fault training sample set constructing unit is configured to construct a hard fault training sample set; said soft fault training sample set constructing unit is configured to construct a soft fault training sample set.

11. The apparatus for the operating state of the circuit according to claim 9, wherein said training sub-module further comprises: a dimension reduction unit, connected to said training sample set constructing sub-module and said training execution unit respectively, and configured to perform dimension-reduction processing on electrical characteristic parameters data of at least one node in said fault training sample set corresponding to each state category of a plurality of state categories.

12. The apparatus for the operating state of the circuit according to claim 9, wherein said neural network forming module comprises a correction sample set constructing sub-module configured to construct a correction sample set;
said training sub-module comprises a correction unit connected to said correction sample set constructing sub-module and said training execution unit respectively and configured to correct the trained neural network according to said correction sample set.

13. The apparatus for the operating state of the circuit according to claim 12, wherein said correction sample set constructing sub-module comprises at least one of a hard fault correction sample set constructing unit and a soft fault correction sample set constructing unit connected to said correction unit; wherein said hard fault correction sample set constructing unit is configured to construct a hard fault correction sample set; said soft fault correction sample set constructing unit is configured to construct a soft fault correction sample set.

14. A non-transitory computer readable storage medium, configured to store computer instructions, wherein said computer instructions executes one or more steps in said detection method of the operating state of the circuit according to claim 1 when being ran by a processor.

15. A non-transitory computer product, comprising one or more processors, wherein said processor is configured to run computer instructions to execute one or more steps of said detection method of the operating state of the circuit according to claim 1.

* * * * *